US009568569B2

(12) United States Patent
Mikami (10) Patent No.: US 9,568,569 B2
(45) Date of Patent: Feb. 14, 2017

(54) DEVICE FOR DETECTING QUENCH IN SUPERCONDUCTING COIL (71) Applicant: Sumitomo Heavy Industries, Ltd., Tokyo (JP)

(72) Inventor: Yukio Mikami, Kanagawa (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 0 days.

(21) Appl. No.: 14/691,306

(22) Filed: Apr. 20, 2015

(65) Prior Publication Data

US 2015/0226814 A1 Aug. 13, 2015

Related U.S. Application Data (63) Continuation of application No. PCT/JP2013/072194, filed on Aug. 20, 2013.

(30) Foreign Application Priority Data

Oct. 24, 2012 (JP) ................................ 2012-234723

(51) Int. Cl.
*G01N 27/00* (2006.01)
*G01R 33/12* (2006.01)
(Continued)

(52) U.S. Cl.
CPC .............. *G01R 33/1238* (2013.01); *H01F 6/02* (2013.01); *G01K 1/00* (2013.01); *H01F 1/00* (2013.01); *H01L 2221/00* (2013.01)

(58) Field of Classification Search
CPC .............. H01F 1/00; G01R 1/00; H01R 3/00; G01K 1/00; G01K 2201/00; H01L 21/00; H01L 2221/00
See application file for complete search history.

(56) References Cited

U.S. PATENT DOCUMENTS 4,996,472 A * 2/1991 Mallick, Jr. ............ H02H 7/001
324/546
5,548,262 A * 8/1996 Kugai ................ G01R 33/0358
324/248

(Continued)

FOREIGN PATENT DOCUMENTS

CN 101221228 A 7/2008
CN 102610351 A 7/2012
(Continued)

OTHER PUBLICATIONS

International Search Report issued in Application No. PCT/JP2013/072194, mailed Sep. 17, 2013.
(Continued)

*Primary Examiner* — Jermele M Hollington
*Assistant Examiner* — Temilade Rhodes-Vivour
(74) *Attorney, Agent, or Firm* — Michael Best & Friedrich LLP (57) ABSTRACT A device for detecting a quench in a superconducting coil according to one aspect of the invention includes a first superconducting coil and a second superconducting coil that are connected in series. The first superconducting coil and the second superconducting coil have the same shape. A first axis of the first superconducting coil and a second axis of the second superconducting coil are arranged at the same position and in the same direction, and the position of the first superconducting coil and the position of the second superconducting coil in the direction of the first and second axes are the same. The length of a winding wire of the first superconducting coil and the length of a winding wire of the second superconducting coil are equal to each other.

7 Claims, 7 Drawing Sheets (51) Int. Cl.
*H01F 6/02* (2006.01)
*H01F 1/00* (2006.01)
*G01K 1/00* (2006.01)

(56) References Cited

U.S. PATENT DOCUMENTS

| | | | | |
|---|---|---|---|---|
| 5,683,179 | A * | 11/1997 | Lowry | G01K 11/20 374/161 |
| 5,739,997 | A * | 4/1998 | Gross | G01R 33/288 335/216 |
| 5,892,644 | A * | 4/1999 | Evans | H01F 6/00 361/19 |
| 7,615,998 | B2 | 11/2009 | Huang et al. | |
| 7,876,100 | B2 | 1/2011 | Huang et al. | |
| 7,898,778 | B2 | 3/2011 | Kurusu et al. | |
| 2002/0030952 | A1* | 3/2002 | Buckles | H01F 6/003 361/19 |
| 2008/0164877 | A1* | 7/2008 | Huang | G01R 33/288 324/319 |
| 2009/0046399 | A1* | 2/2009 | Kurusu | H01F 6/02 361/19 |
| 2010/0013584 | A1 | 1/2010 | Huang et al. | |
| 2012/0014030 | A1 | 1/2012 | Ichiki et al. | |
| 2013/0090243 | A1* | 4/2013 | Edwards | H01F 6/00 505/163 |

FOREIGN PATENT DOCUMENTS

| | | |
|---|---|---|
| JP | H08-102414 A | 4/1996 |
| JP | H09-084252 A | 3/1997 |
| JP | H10-106829 A | 4/1998 |
| JP | 2000-277322 A | 10/2000 |
| JP | 2007-234689 A | 9/2007 |
| JP | 2012-023168 A | 2/2012 |
| JP | 2012-238628 A | 12/2012 |
| WO | WO-2006/115126 A1 | 11/2006 |

OTHER PUBLICATIONS

Office Action issued in Chinese Application No. 201380054248.X, dated Jul. 5, 2016.

* cited by examiner

DEVICE FOR DETECTING QUENCH IN SUPERCONDUCTING COIL

RELATED APPLICATIONS

Priority is claimed to Japanese Patent Application No. 2012-234723, filed Oct. 24, 2012, and International Patent Application No. PCT/JP2013/072194, filed Aug. 20, 2013, the entire content of each of which is incorporated herein by reference.

BACKGROUND

Technical Field

Certain embodiments of the present invention relate to a device for detecting a quench in a superconducting coil.

Description of Related Art

A device for detecting a quench in a superconducting coil is known. A superconducting coil of this device is constituted of a first superconducting coil and a second superconducting coil that are connected in series. The first superconducting coil and the second superconducting coil are connected together at a middle point of the superconducting coil, that is, a middle point of the entire coil. Also, a minute voltage generated with a quench is detected by measuring a voltage between terminals of the first superconducting coil and a voltage between terminals of the second superconducting coil and by obtaining a deviation between these measurement values.

SUMMARY

According to an embodiment of the present invention, there is provided a device for detecting a quench in a superconducting coil including a first superconducting coil and a second superconducting coil that are connected in series. The first superconducting coil and the second superconducting coil have the same shape. A first axis of the first superconducting coil and a second axis of the second superconducting coil are arranged at the same position and in the same direction, and the position of the first superconducting coil and the position of the second superconducting coil in the direction of the first and second axes are the same. A length of a winding wire of the first superconducting coil and a length of a winding wire of the second superconducting coil are equal to each other.

DETAILED DESCRIPTION

In the above-described device of the related-art, if a magnetic material, such as iron, is present in the vicinity of the superconducting coil, this magnetic material may cause disturbance. When the voltages between the terminals of the superconducting coils are influenced due to the presence of the magnetic material, the voltage between the terminals of a first superconducting coil and the voltage between the terminals of a second superconducting coil are not cancelled out (the deviation does not reach zero), and the voltages remain, even in a state where no quench occurs. As a result, the lower limit of a voltage deviation capable of detecting a quench becomes large, and detection sensitivity related to a quench deteriorates.

Due to the deterioration of the detection sensitivity related to a quench, detection of the quench is delayed and burnout risk in the superconducting coil increases. For this reason, in the related art, it is difficult to detect a quench with high sensitivity.

It is desirable to provide a device for detecting a quench in a superconducting coil that can detect a quench with high sensitivity.

In the device for detecting a quench in a superconducting coil, the first superconducting coil and the second superconducting coil may have the same shape. Moreover, the first axis of the first superconducting coil and the second axis of the second superconducting coil may be arranged at the same position and in the same direction, and the position of the first superconducting coil and the position of the second superconducting coil in the direction of the first and second axes may be the same. In this way, the first superconducting coil and the second superconducting coil may have the same geometrical shape, and the axes and positions thereof coincide with each other, respectively. Moreover, the length of the winding wire of the first superconducting coil and the length of the winding wire of the second superconducting coil may be equal to each other. Hence, even in a case where a magnetic material is present in the vicinity of the first and second superconducting coils, the degrees of influence exerted on the first and second superconducting coils by the magnetic material become substantially equal to each other. Hence, the degrees of influence of disturbance caused by the magnetic material are substantially offset in the deviation in the voltage between the terminals of the first superconducting coil and the voltage between the terminals of the second superconducting coil. Therefore, the lower limit of the voltage deviation capable of detecting a quench is made smaller, and the quench can be detected with high sensitivity.

Additionally, the intermediate tap may be provided between the first superconducting coil and the second superconducting coil. According to this configuration, the deviation between the voltage between the terminals of the first superconducting coil and the voltage between the terminals of the second superconducting coil can be measured using a simple configuration.

Additionally, the winding wire of the first superconducting coil and the winding wire of the second superconducting coil may be adjacent to each other. According to this configuration, the degrees of influence exerted on the first and second superconducting coils by the magnetic material coincide with each other better. Hence, the degrees of influence of the disturbance can be precisely offset, and the lower limit of the voltage deviation for detecting a quench can be made smaller.

Additionally, the winding wire of the first superconducting coil and the winding wire of the second superconducting coil may be co-wound. A quench can be detected with high sensitivity through a simple manufacturing method.

Additionally, the winding wire of the first superconducting coil and the winding wire of the second superconducting coil may have a flat shape and may overlap each other.

Additionally, the position of the winding wire of the first superconducting coil in a radial direction and the position of the winding wire of the second superconducting coil in the radial direction may be switched.

Additionally, the winding wire of the first superconducting coil and the winding wire of the second superconducting coil may have a circular cross-sectional shape and may be twisted together with each other.

Additionally, the winding wire of the first superconducting coil and the winding wire of the second superconducting coil may be formed such that a plurality of pancake coils are alternately laminated in the direction of the first and second axes.

Hereinafter, embodiments of the invention will be described referring to the drawings. In addition, in the description of the drawings, the same reference numerals will be given to the same elements, and overlapping description will be omitted.

Figure 1:
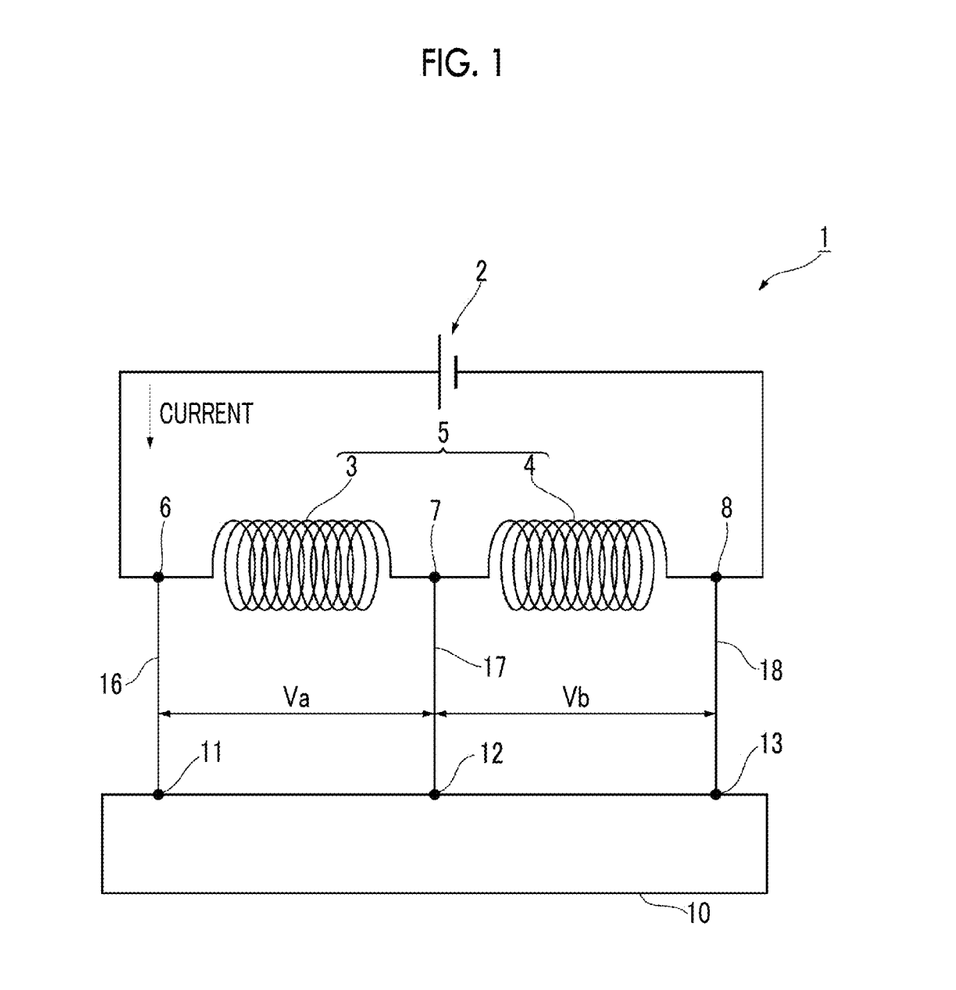
FIG. 1 is a circuit diagram illustrating the configuration of a quench detecting device according to an embodiment of the invention.

A quench detecting device 1 of a first embodiment will be described with reference to FIGS. 1 to 3. First, a circuit configuration of the quench detecting device 1 will be described with reference to FIG. 1. The quench detecting device 1 includes a DC power source 2 that outputs a direct current voltage, and a first superconducting coil 3 and a second superconducting coil 4 that are connected to DC power source 2. The first superconducting coil 3 and the second superconducting coil 4 are connected in series. The first superconducting coil 3 and the second superconducting coil 4 are high-temperature superconducting coils made of, for example, high-temperature superconductors, such as copper oxide containing yttrium. A superconducting coil 5 is constituted of the first superconducting coil 3 and the second superconducting coil 4. The superconducting coil 5 is mounted on a superconducting magnet device, and is primarily used as an electromagnet.

A voltage tap 16 is connected to one terminal 6 of the first superconducting coil 3. A voltage tap (intermediate tap) 17 is connected to an intermediate terminal 7 between the first superconducting coil 3 and the second superconducting coil 4. A voltage tap 18 is connected to the other terminal of the second superconducting coil 4.

The quench detecting device 1 includes a detector 10 for detecting a quench in the superconducting coil 5. The detector 10 has an input terminal 11 connected to the voltage tap 16, an input terminal 12 connected to the voltage tap 17, and an input terminal 13 connected to the voltage tap 18. The detector 10 measures a first voltage $V_a$ between the terminals 6 and 7 of the first superconducting coil 3. The detector 10 measures a second voltage $V_b$ between the terminals 7 and 8 of the second superconducting coil 4. The detector 10 stores a threshold value $V_{TH}$ for determining the occurrence of a quench. The detector 10 determines the presence/absence of the occurrence of a quench, on the basis of a deviation between the first voltage $V_a$ and the second voltage $V_b$.

More specifically, the detector 10 determines that a quench has occurred in the superconducting coil 5 when the following Expression (1) is satisfied.

$$|V_a - V_b| > \tag{1}$$

Figure 2:
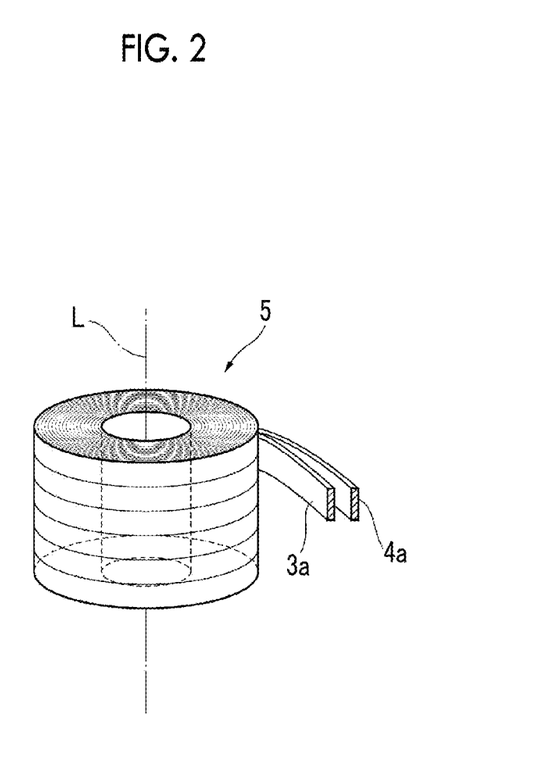
FIG. 2 is a view illustrating an arrangement relationship of a winding wire in a superconducting coil in FIG. 1.

As illustrated in FIG. 2, winding wires 3a and 4a used for the first superconducting coil 3 and the second superconducting coil 4 have a flat shape. In other words, the winding wires 3a and 4a are made of a sheet-like superconductor. The winding wire 3a and the winding wire 4a overlap each other in a state where the thickness direction thereof is orthogonal to an axis L. That is, the winding wire 3a and the winding wire 4a are co-wound in a state where the winding wires are adjacent to each other in a radial direction.

Figure 3:
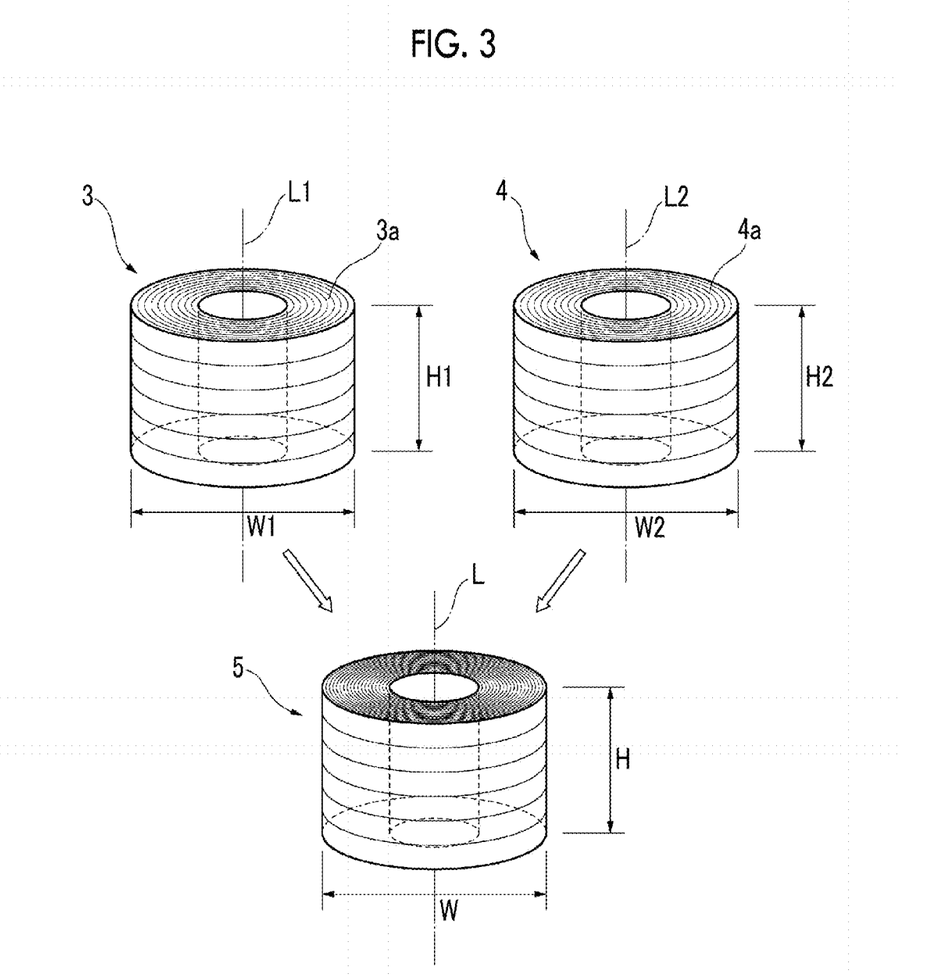
FIG. 3 is an explanatory view of geometric shapes in a first superconducting coil, a second superconducting coil, and the superconducting coil.

As illustrated in FIG. 3, when the winding wire 3a and the winding wire 4a that are co-wound are conceptually separated and considered, the first superconducting coil 3 formed by the winding wire 3a and the second superconducting coil 4 formed by the winding wire 4a have the same shape. That is, the diameter W1 of the first superconducting coil 3 and the diameter W2 of the second superconducting coil 4 are equal to each other, and both the diameter W1 and the diameter W2 are equal to the diameter W of the superconducting coil 5 formed by the first superconducting coil 3 and the second superconducting coil 4. The height H1 of the first superconducting coil 3 and the height H2 of the second superconducting coil 4 are equal to each other, and both the height H1 and the height H2 are equal to the height H of the superconducting coil 5 formed by the first superconducting coil 3 and the second superconducting coil 4.

Moreover, a first axis L1 of the first superconducting coil 3 and a second axis L2 of the second superconducting coil 4 are arranged at the same position and in the same direction. That is, the first axis L1 and the second axis L2 coincide with each other in position and direction. The first axis L1 and the second axis L2 coincide with the axis L of the superconducting coil 5 formed by the first superconducting coil 3 and the second superconducting coil 4. The position of the first superconducting coil 3 and the position of the second superconducting coil 4 in the direction of the axis L are the same. In other words, the outer shape (or region) formed by the first superconducting coil 3 and the outer shape (or region) formed by the second superconducting coil 4 coincide with each other, and the superconducting coils 3 and 4 spatially are the same.

The length of the winding wire 3a of the first superconducting coil 3 and the length of the winding wire 4a of the second superconducting coil 4 are equal to each other. In other words, the length of the winding wire 3a from the terminal 6 to the terminal 7 illustrated in FIG. 1 and the length of the winding wire 4a from the terminal 7 to the terminal 8 are equal to each other. The first superconducting coil 3 and the second superconducting coil 4 have the same inductance. In the superconducting coil 5, the space factor of the winding wire 3a and the space factor of the winding wire 4a are equal to each other.

According to the quench detecting device 1 for the superconducting coil 5, the first superconducting coil 3 and the second superconducting coil 4 have the same geometrical shape, and the axes L1 and L2 and the positions thereof coincide with each other. Moreover, the length of the winding wire 3a of the first superconducting coil 3 and the length of the winding wire 4a of the second superconducting coil 4 are equal to each other. Hence, even in a case where a magnetic material is present in the vicinity of the first and second superconducting coils 3 and 4, the degrees of influence exerted on the first and second superconducting coils 3 and 4 by the magnetic material become substantially equal to each other. Hence, the degrees of influence of disturbance caused by the magnetic material are substantially offset in the deviation in the voltage $V_a$ between the terminals 6 and 7 of the first superconducting coil 3 and the voltage $V_b$ between the terminals 7 and 8 of the second superconducting coil 4. Therefore, the lower limit $V_{TH}$ of the voltage deviation for detecting a quench is made to be small, and the quench can be detected with high sensitivity. As a result, the quench can be quickly detected, and burnout risk in a superconducting coil can be reduced.

Figure 4:
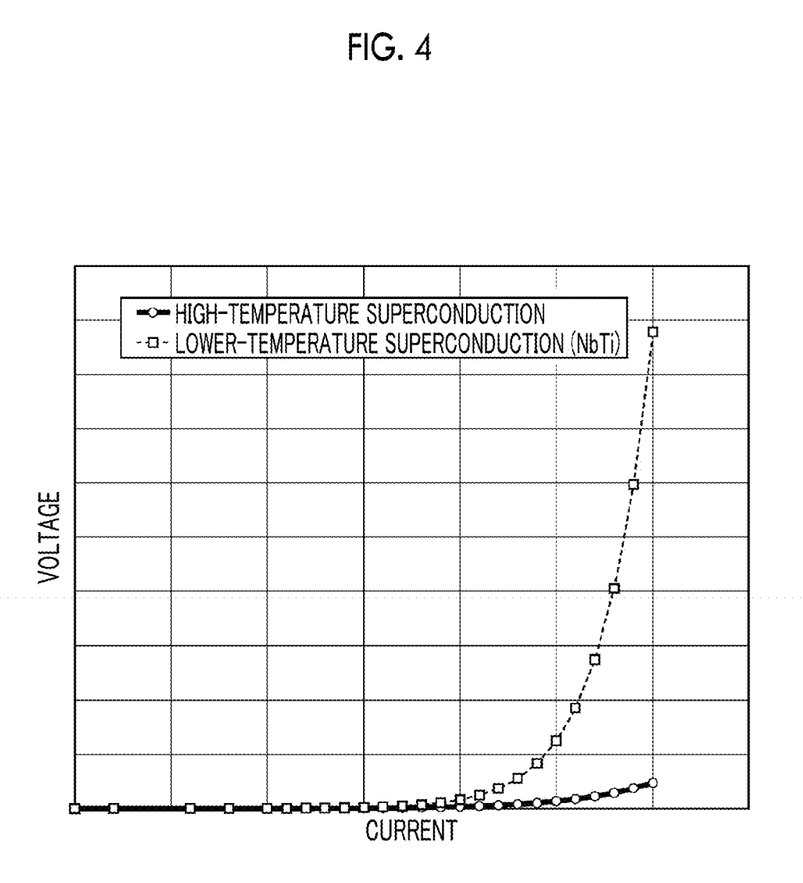
FIG. 4 is a view illustrating voltage characteristics in a high-temperature superconductor and a low-temperature superconductor.

Generally, in high-temperature superconducting coils, a change in a voltage does not occur easily as compared to low-temperature superconducting coils. As illustrated in FIG. 4, in a low-temperature superconducting coil using niobium titanium or the like for a conductor, the voltage value rises dramatically with an increase in a current. On the other hand, in a high-temperature superconducting coil, even if the current increases, the change in the voltage is gentle, and the voltage value increases gradually. In such a high-temperature superconducting coil, if the lower limit of a voltage deviation for detecting a quench is large, there is a concern that the temperature of a quench place may be very high when the quench is detected, and a winding wire may be burned off.

Figure 7A:
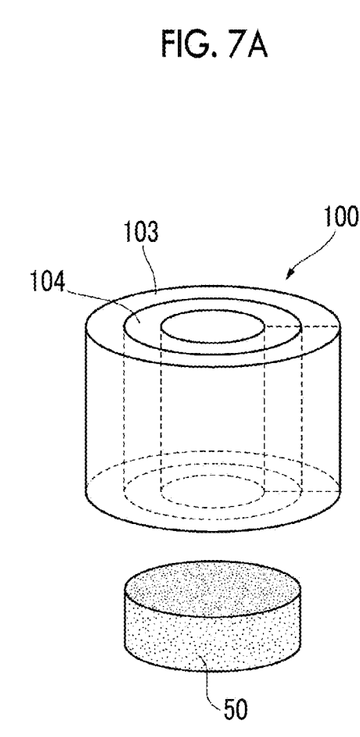
FIG. 7A and FIG. 7B are respective views illustrating arrangement relationships of related-art winding wires.
Figure 7B:
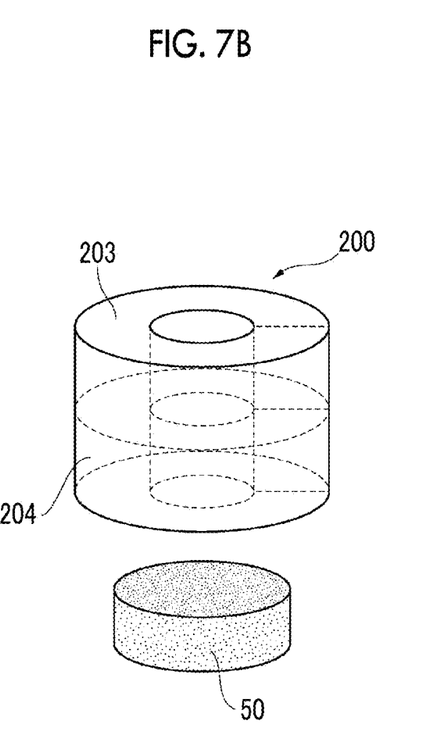

For example, as illustrated in FIG. 7A, in superconducting coil 100 of the related-art, which has an outer-peripheral-side coil 103 and an inner-peripheral-side coil 104, when a ferromagnetic material 50, such as iron, is present around the superconducting coil, an influence that the outer-peripheral-side coil 103 is exerted by the ferromagnetic material 50 is different from an influence that the inner-peripheral-side coil 104 is exerted by the ferromagnetic material 50, even in a case where the coils 103 and 104 have the same inductance. This is because the geometric shapes and the positions of the outer-peripheral-side coil 103 and the inner-peripheral-side coil 104 are different from each other. Additionally, as illustrated in FIG. 7B, in a superconducting coil 200 of the related-art, which has an upper-stage coil 203 and a lower-stage coil 204, when the ferromagnetic material 50, such as iron, is present around the superconducting coil, an influence that the upper-stage coil 203 is exerted by the ferromagnetic material 50 is different from an influence that the lower-stage coil 204 is exerted by the ferromagnetic material 50, even in a case where the coils 203 and 204 have the same inductance. This is because, even if the geometric shapes of the upper-stage coil 203 and the lower-stage coil 204 are the same, relative positional relationships with the ferromagnetic material 50 are different from each other.

Hence, in the related-art superconducting coil 100 or the related-art superconducting coil 200, the influence of disturbance caused by the ferromagnetic material 50 is great, and the absolute value of "$V_a - V_b$" does not reach zero but shows a constant value. Hence, it is inevitably necessary to make the lower limit of the voltage deviation for detecting a quench large, and the detection sensitivity of the quench is poor.

According to the quench detecting device 1, also in the case of the high-temperature superconducting coil, the influence of disturbance caused by the ferromagnetic material 50 can be made to be small, and the detection sensitivity of a quench is enhanced.

Additionally, since the intermediate tap 17 is provided between the first superconducting coil 3 and the second superconducting coil 4, the deviation between the voltage $V_a$ between the terminals 6 and 7 of the first superconducting coil 3 and the voltage $V_b$ between the terminals 7 and 8 of the second superconducting coil 4 can be measured using a simple configuration.

Additionally, since the winding wire 3a of the first superconducting coil 3 and the winding wire 4a of the second superconducting coil 4 are adjacent to each other, the degrees of influence exerted on the first and second superconducting coils 3 and 4 by the magnetic material coincide with each other better. Hence, the degrees of influence of the disturbance can be precisely offset, and the lower limit $V_{TH}$ of the voltage deviation for detecting a quench can be made smaller.

Additionally, since the winding wire 3a of the first superconducting coil 3 and the winding wire 4a of the second superconducting coil 4 are co-wound, a quench can be detected with high sensitivity through a simple manufacturing method.

Next, other embodiments of the superconducting coil will be described with reference to FIGS. 5A to 6.

Figure 5A:
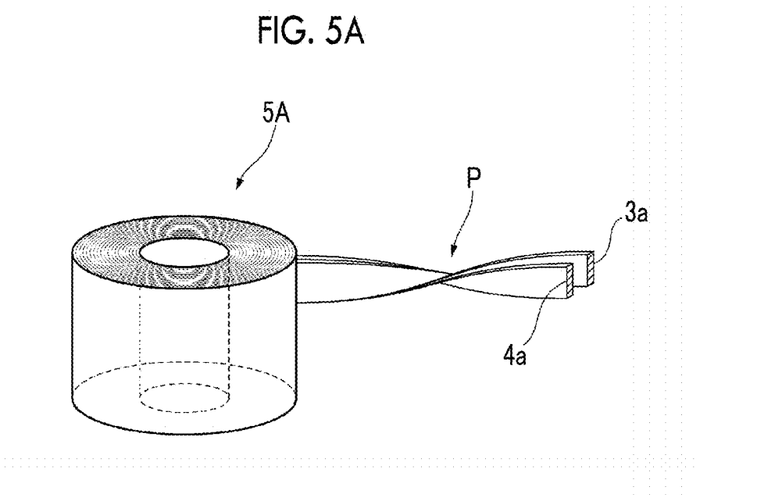
FIG. 5A is a view illustrating an arrangement relationship of a winding wire in a superconducting coil of a second embodiment.

As illustrated in FIG. 5A, a difference between a superconducting coil 5A of a second embodiment and the superconducting coil 5 of the first embodiment is that the position of the winding wire 3a of the first superconducting coil 3 and the position of the winding wire 4a of the second superconducting coil 4 in the radial direction are switched. That is, the winding wire 3a of the first superconducting coil 3 and the winding wire 4a of the second superconducting coil 4 are twisted by 180 degrees at a predetermined point P, in a mutually overlapped state. The same actions and effects as those of the superconducting coil 5 are exhibited also in such a superconducting coil 5A. Additionally, in the winding wire 3a and the winding wire 4a that are co-wound, a situation in which the length of a winding wire on an inner peripheral side becomes shorter than the length of a winding wire on an outer peripheral side can be avoided. Thus, it is easy to make the length of the winding wire 3a and the length of the winding wire 4a coincide with each other. The predetermined point P may be provided at one place, and may be provided in two or more places.

Figure 5B:
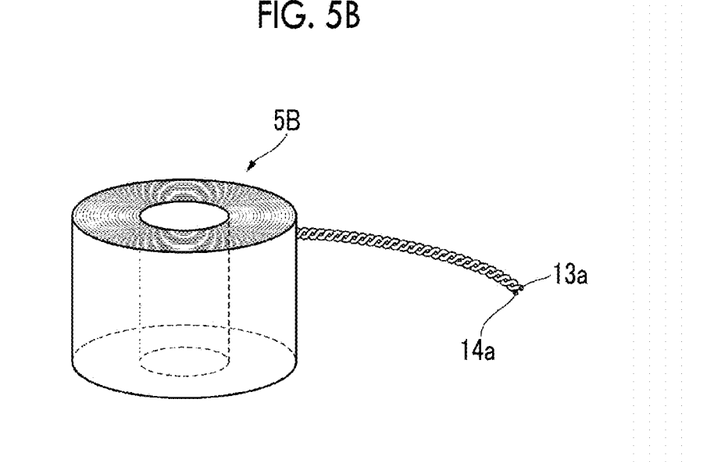
FIG. 5B is a view illustrating an arrangement relationship of a winding wire in a superconducting coil of a third embodiment.

As illustrated in FIG. 5B, the difference between a superconducting coil 5B of a third embodiment and the superconducting coil 5 of the first embodiment is that the winding wires 13a and 14a are twisted together with each other using the winding wire 13a of the first superconducting coil 3 and the winding wire 14a of the second superconducting coil 4 that have a circular cross-sectional shape, instead of the flat winding wires 3a and 4a. The same actions and effects as those in the superconducting coil 5 are also exhibited in such a superconducting coil 5B.

Figure 6:
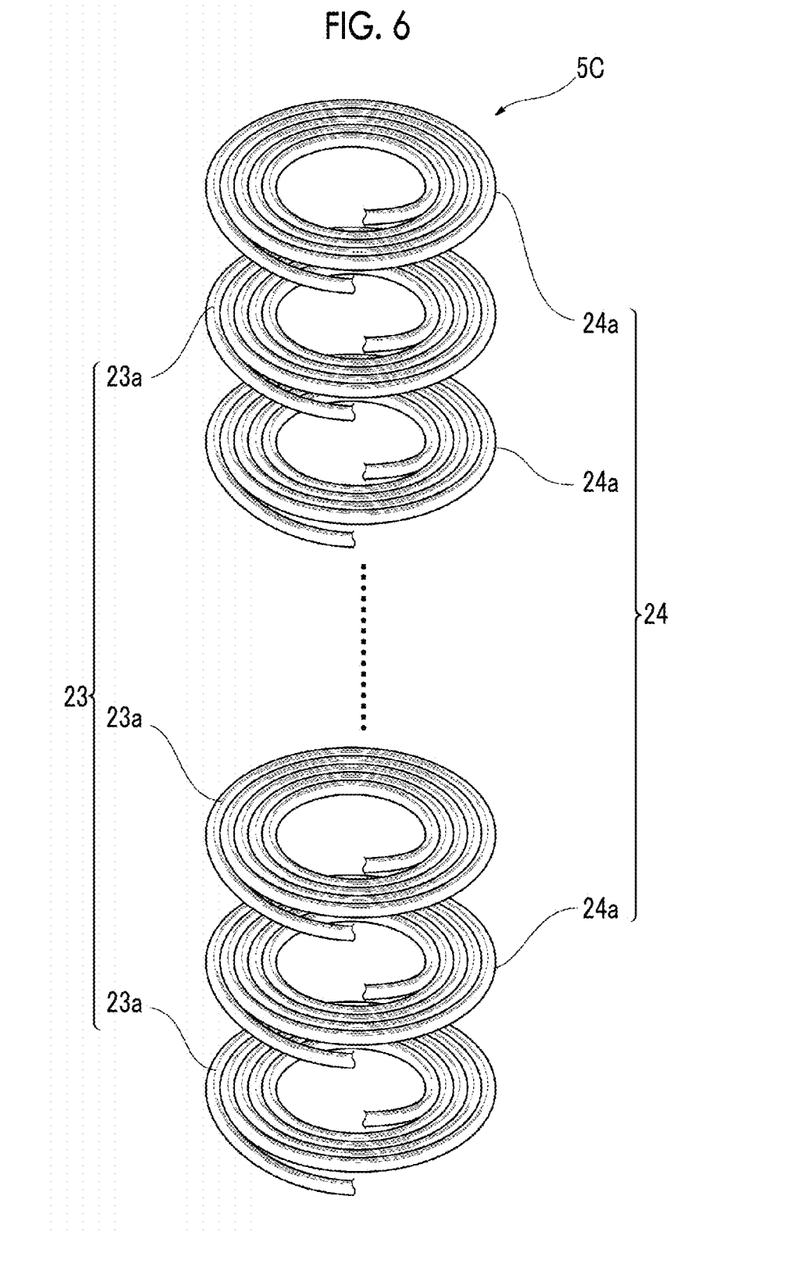
FIG. 6 is a view illustrating an arrangement relationship of a winding wire in a superconducting coil of a fourth embodiment.

As illustrated in FIG. 6, the difference between a superconducting coil 5C of a fourth embodiment and the superconducting coil 5 of the first embodiment is that a plurality of pancake coils 23a and 24a are alternately laminated in the direction of the axis L, using a first superconducting coil 23 and a second superconducting coil 24 made of the plurality of pancake coils 23a and 24a, instead of the flat winding wires 3a and 4a that are co-wound. Even in the first superconducting coil 23 and the second superconducting coil 24, a winding wire of the pancake coil 23a and a winding wire of the pancake coil 24a are adjacent to each other in the direction of axis L. The same actions and effects as those in the superconducting coil 5 are exhibited even in such a superconducting coil 5C.

Although the embodiments of the invention have been described above, the invention is not limited to the above embodiments. For example, although a case where the first superconducting coil 3 and the second superconducting coil 4 are high-temperature superconducting coils has been described in the above embodiments, the first and second superconducting coils may be low-temperature superconducting coils. The shapes of the winding wires that constitute the first superconducting coil 3 and the second superconducting coil 4 may be different from those of the above respective embodiments. The invention is not limited to a case where the winding wire 3a of the first superconducting coil 3 and the winding wire 4a of the second superconducting coil 4 are co-wound, and the winding wires may not be co-wound if the winding wires have the same space factor in the same region.

According to one aspect of the invention, a quench can be detected with high sensitivity.

It should be understood that the invention is not limited to the above-described embodiments, but may be modified into various forms on the basis of the spirit of the invention. Additionally, the modifications are included in the scope of the invention.

What is claimed is:

1. A device for detecting a quench in a superconducting coil comprising:
    a first superconducting coil and a second superconducting coil that are connected in series,
    an intermediate tap that is provided between the first superconducting coil and the second superconducting coil, and
    a detector configured to measure a first voltage of the first superconducting coil, to measure a second voltage of the second superconducting coil, and to determine the presence or absence of the occurrence of a quench on the basis of a deviation between the first voltage and the second voltage, and on the basis of a stored threshold value,
    wherein the first superconducting coil and the second superconducting coil have the same shape,
    wherein a first axis of the first superconducting coil and a second axis of the second superconducting coil are arranged at the same position and in the same direction, and a position of the first superconducting coil and a position of the second superconducting coil in the direction of the first and second axes are the same, and
    wherein a length of a winding wire of the first superconducting coil and a length of a winding wire of the second superconducting coil are equal to each other.

2. The device for detecting a quench in a superconducting coil according to claim 1, wherein the winding wire of the first superconducting coil and the winding wire of the second superconducting coil are adjacent to each other.

3. The device for detecting a quench in a superconducting coil according to claim 2, wherein the winding wire of the first superconducting coil and the winding wire of the second superconducting coil are co-wound.

4. The device for detecting a quench in a superconducting coil according to claim 3, wherein the winding wire of the first superconducting coil and the winding wire of the second superconducting coil have a flat shape and overlap each other.

5. The device for detecting a quench in a superconducting coil according to claim 4, wherein the position of the winding wire of the first superconducting coil in a radial direction and the position of the winding wire of the second superconducting coil in the radial direction are switched.

6. The device for detecting a quench in a superconducting coil according to claim 3, wherein the winding wire of the first superconducting coil and the winding wire of the second superconducting coil have a circular cross-sectional shape and are twisted together with each other.

7. The device for detecting a quench in a superconducting coil according to claim 2, wherein the winding wire of the first superconducting coil and the winding wire of the second superconducting coil are formed such that a plurality of pancake coils are alternately laminated in the direction of the first and second axes.

* * * * *